(12) United States Patent
Furuya et al.

(10) Patent No.: US 11,193,205 B2
(45) Date of Patent: Dec. 7, 2021

(54) SOURCE MATERIAL CONTAINER

(71) Applicant: TOKYO ELECTRON LIMITED, Tokyo (JP)

(72) Inventors: Yuichi Furuya, Nirasaki (JP); Hiroyuki Mori, Nirasaki (JP); Einosuke Tsuda, Nirasaki (JP); Eiichi Komori, Nirasaki (JP); Tomohisa Kimoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 167 days.

(21) Appl. No.: 16/211,055

(22) Filed: Dec. 5, 2018

(65) Prior Publication Data
US 2019/0180988 A1  Jun. 13, 2019

(30) Foreign Application Priority Data
Dec. 12, 2017 (JP) .............................. JP2017-237406

(51) Int. Cl.
*C23C 16/448* (2006.01)
*H01J 37/32* (2006.01)
*C23C 14/24* (2006.01)

(52) U.S. Cl.
CPC ........ *C23C 16/4481* (2013.01); *C23C 14/243* (2013.01); *H01J 37/3244* (2013.01); *H01J 37/32449* (2013.01); *H01J 37/32458* (2013.01)

(58) Field of Classification Search
CPC .......................... C23C 16/4481; C23C 14/243
USPC ................................................ 118/726, 727
See application file for complete search history.

(56) References Cited

U.S. PATENT DOCUMENTS

| | | | | |
|---|---|---|---|---|
| 7,300,038 B2* | 11/2007 | Gregg | ................ | C23C 16/4481 118/726 |
| 2003/0047141 A1* | 3/2003 | Warnes | ............... | C23C 16/4488 118/726 |
| 2005/0066893 A1* | 3/2005 | Soininen | ............. | C23C 16/4481 118/715 |
| 2005/0072357 A1* | 4/2005 | Shero | ................ | C23C 16/45544 118/715 |
| 2008/0202426 A1* | 8/2008 | Suzuki | ............... | C23C 16/4481 118/726 |

(Continued)

FOREIGN PATENT DOCUMENTS

| | | |
|---|---|---|
| CN | 101065516 A | 10/2007 |
| CN | 105331953 A | 2/2016 |

(Continued)

*Primary Examiner* — Aiden Lee
(74) *Attorney, Agent, or Firm* — Fenwick & West LLP

(57) ABSTRACT

A source material container includes a housing, a tray assembly and a plurality of cylindrical members. The housing provides a carrier gas introduction port and an opening through which a gas containing source material vapor is outputted. The tray assembly trays stacked in the housing. The cylindrical members are arranged in a radial direction between the tray assembly and the housing. The outermost cylindrical member provides a slit and each of the other cylindrical members than the outermost cylindrical member provides a plurality of slits. From the introduction port to the gap between the tray assembly and the innermost cylindrical member, the flow path of the carrier gas is branched in a stepwise manner in the height direction.

7 Claims, 18 Drawing Sheets

(56) References Cited

U.S. PATENT DOCUMENTS

| | | | | |
|---|---|---|---|---|
| 2009/0107401 A1* | 4/2009 | Reinhold | ............. | C23C 14/228 |
| | | | | 118/726 |
| 2009/0162260 A1* | 6/2009 | Bera | ....................... | B01J 19/26 |
| | | | | 422/186.04 |
| 2009/0181168 A1* | 7/2009 | Chaubey | ............. | C23C 16/4481 |
| | | | | 427/248.1 |
| 2015/0191819 A1* | 7/2015 | Hendrix | ................ | C23C 16/455 |
| | | | | 118/728 |

FOREIGN PATENT DOCUMENTS

| | | | |
|---|---|---|---|
| JP | 2014-009392 A | 1/2014 | |
| KR | 10-2007-0089785 A | 9/2007 | |
| KR | 10-2014-0004007 A | 1/2014 | |

\* cited by examiner

SOURCE MATERIAL CONTAINER

CROSS-REFERENCE TO RELATED APPLICATION

This application claims priority to Japanese Patent Application No. 2017-237406 filed on Dec. 12, 2017, the entire contents of which are incorporated herein by reference.

FIELD OF THE INVENTION

The present disclosure relates to a source material container.

BACKGROUND OF THE INVENTION

In manufacturing electronic devices, substrate processing is performed by using source material vapor. For example, in film formation, source material vapor is supplied into an inner space of a chamber to deposit a source material on a substrate. The source material is contained in a source material container. The gas containing the source material vapor is outputted from the source material container toward the inner space. The source material container is described in Japanese Patent Application Publication No. 2014-9392.

The source material container described in Japanese Patent Application Publication No. 2014-9392 has a housing and a plurality of trays. The housing provides an introduction port and an opening. A carrier gas is inputted into the housing through the introduction port. The gas containing the source material vapor is outputted from the opening of the housing. The trays are stacked in the housing. Each tray includes an outer peripheral wall, an inner peripheral wall, and a bottom plate. The outer peripheral wall has a cylindrical shape and provides a plurality of inlets. The inner peripheral wall has a cylindrical shape and is provided inside the outer peripheral wall. The bottom plate extends between the outer peripheral wall and the inner peripheral wall. The inner wall provides an outlet. A gap is formed between the outer peripheral walls of the trays and the housing. The introduction port is provided above the gap to communicate with the gap. The carrier gas is supplied into each tray through the introduction port, the gap, and the inlets. The source material vapor accommodated in each tray is outputted together with the carrier gas from the opening of the housing through the outlet.

In the source material container described in Japanese Patent Application Publication No. 2014-9392, the consumption amount of the source material is small in some trays. Therefore, the concentration of the source material in the gas outputted from the source material container is decreased. In the case of using gas having a low concentration of the source material, the speed of substrate processing (e.g., film forming speed) is lowered. Accordingly, it is required to decrease the difference in the consumption amount of the source material in the trays.

SUMMARY OF THE INVENTION

In accordance with an aspect, there is provided a source material container including a housing, a tray assembly and a plurality of cylindrical members. The housing has a bottom plate, a ceiling plate and a cylindrical sidewall extending between the bottom plate and the ceiling plate. The housing provides a carrier gas introduction port and an opening through which a gas containing source material vapor is outputted. The tray assembly is accommodated in the housing and the tray assembly includes a plurality of trays stacked between the bottom plate and the ceiling plate. The cylindrical members are arranged in a radial direction between the tray assembly and the housing. Each of the trays includes a first cylindrical wall, a second cylindrical wall disposed inside the first wall and a third wall extending between the first wall and the second wall, and defines a region, in which the source material is accommodated, by the first wall, the second wall and the third wall. The first cylindrical wall of each of the trays provides an inlet through which an outer side communicates with the region. The second cylindrical wall of each of the trays provides an outlet through which the region communicates with the opening. The tray assembly has an outer wall formed by the first cylindrical wall of each of the trays. A first gap is formed between the outermost one of the cylindrical members and the sidewall, the first gap communicating with the introduction port. A second gap is formed between the innermost one of the cylindrical members and the outer wall of the tray assembly. The outermost cylindrical member provides a slit communicating with the first gap, the slit extending in a circumferential direction. The other cylindrical members than the outermost cylindrical member provide a plurality of slits extending in the circumferential direction at different locations in a height direction to provide a plurality of flow paths branched in a stepwise manner from the slit of the outermost cylindrical member to communicate with the second gap.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
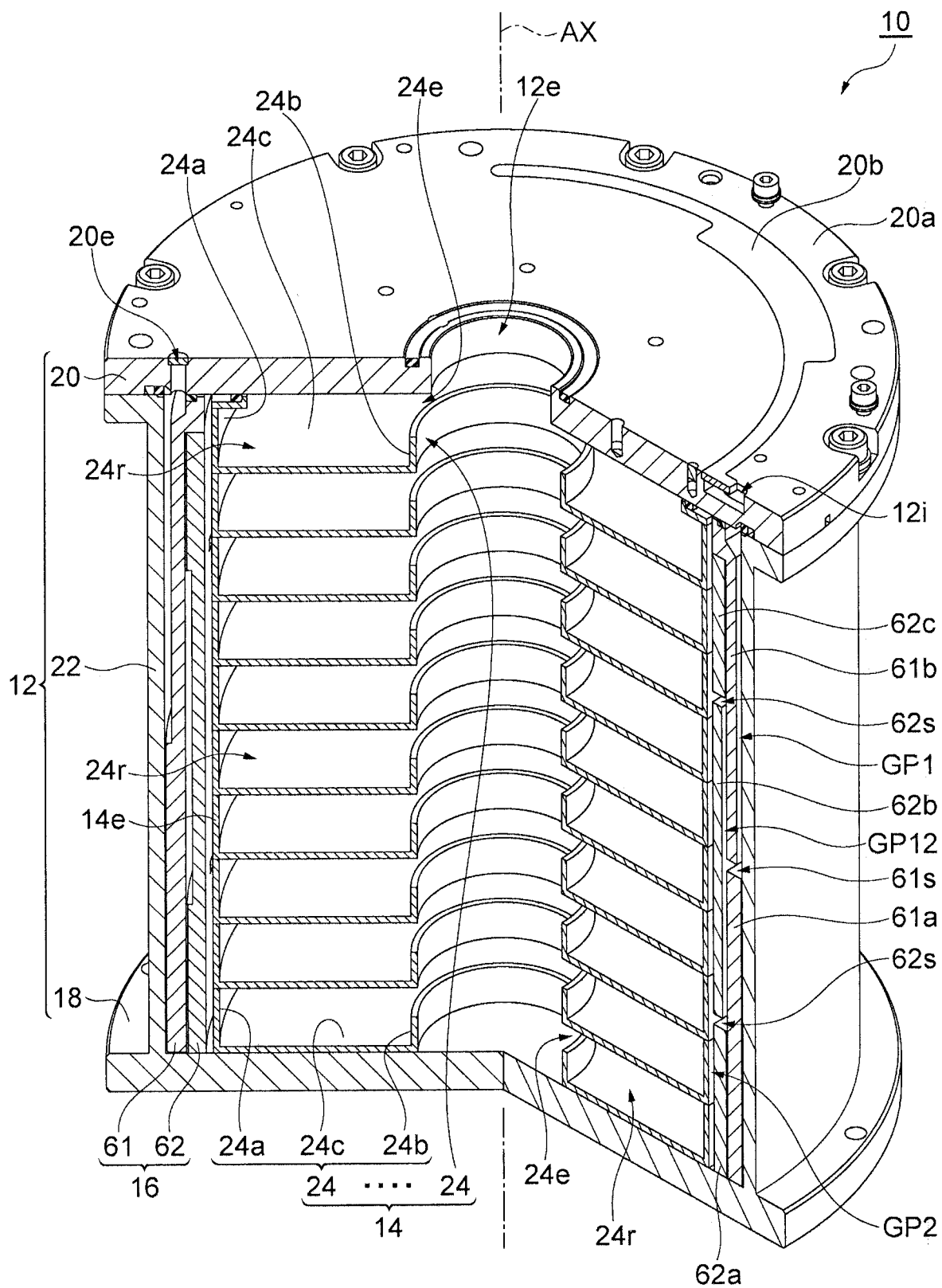
FIG. 1 is a partial cutaway perspective view of a source material container according to an embodiment.

Hereinafter, embodiments will be described in detail with reference to the accompanying drawings. Like reference numerals will be given to like or corresponding parts throughout the drawings.

FIG. 1 is a partial cutaway perspective view of a source material container according to one embodiment. A source material container 10 shown in FIGS. 1 and 2 includes a housing 12, a tray assembly 14, and a plurality of cylindrical members 16. The housing 12 is made of a material, e.g., aluminum, having excellent thermal conductivity. The surface of the housing 12 may be coated.

The housing 12 provides a carrier gas introduction port 12i and an opening 12e. The carrier gas is supplied into the housing 12 of the source material container 10 through the introduction port 12i. The carrier gas is, e.g., carbon monoxide gas. However, the carrier gas is not limited thereto. The gas containing vapor generated by sublimation of the source material in the source material container 10 and the carrier gas is outputted from the opening 12e. The gas outputted from the opening 12e is supplied into the chamber of the substrate processing apparatus.

Figure 3:
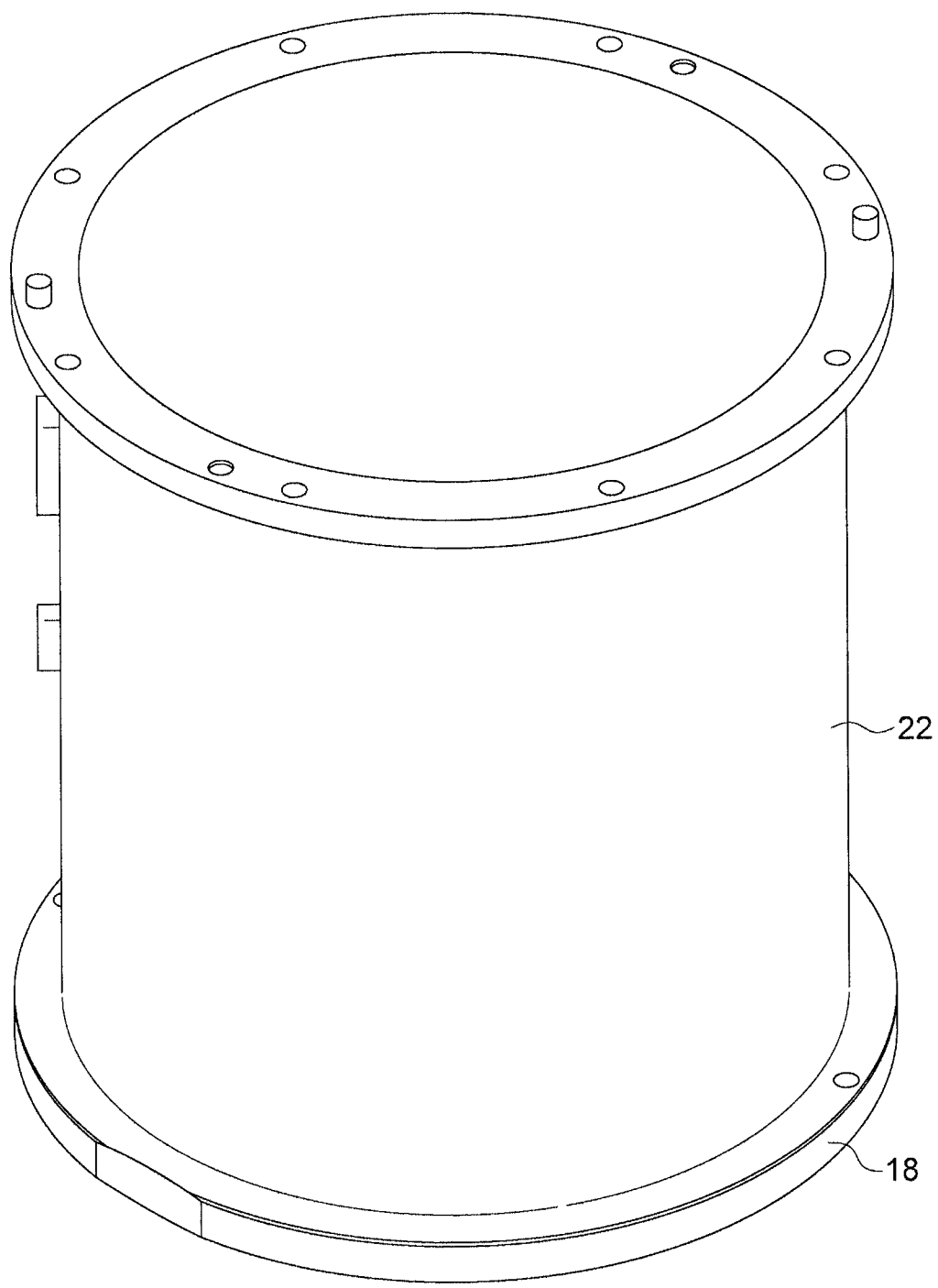
FIG. 3 is a perspective view of a sidewall and a bottom plate of a housing of the source material container shown in FIG. 1.
Figure 4:
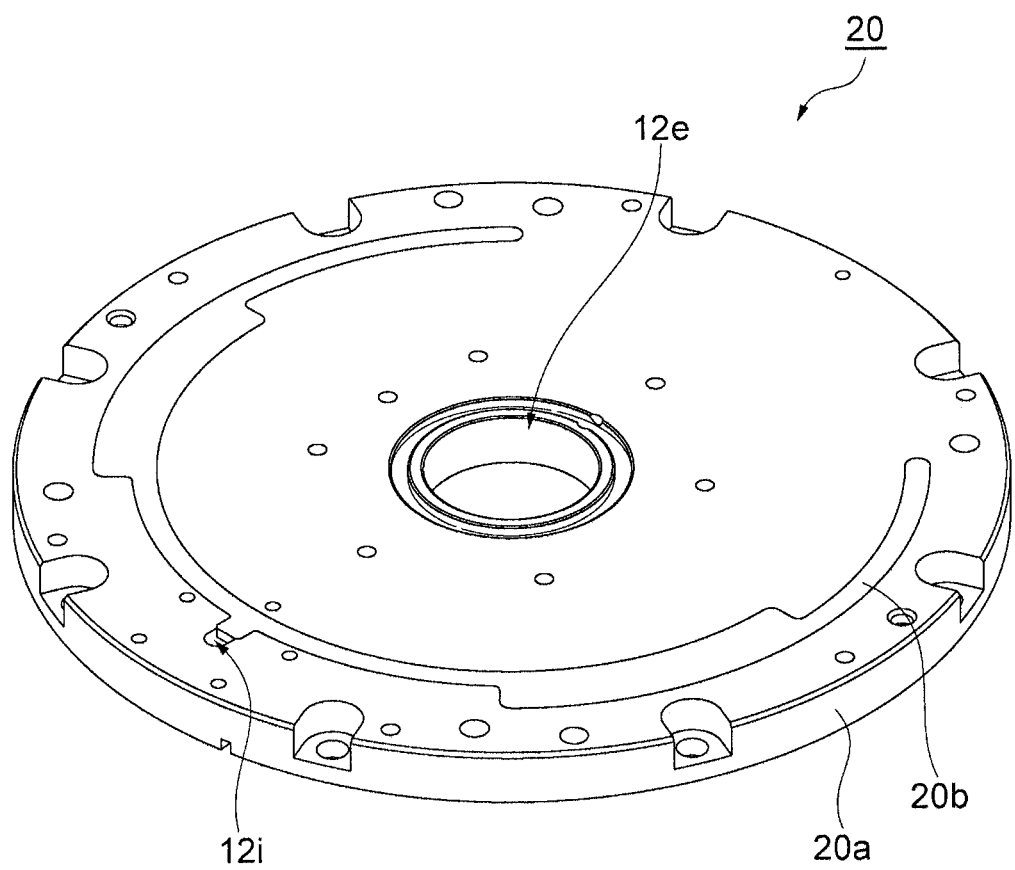
FIG. 4 is a perspective view of a ceiling plate of the housing of the source material container shown in FIG. 1.
Figure 5:
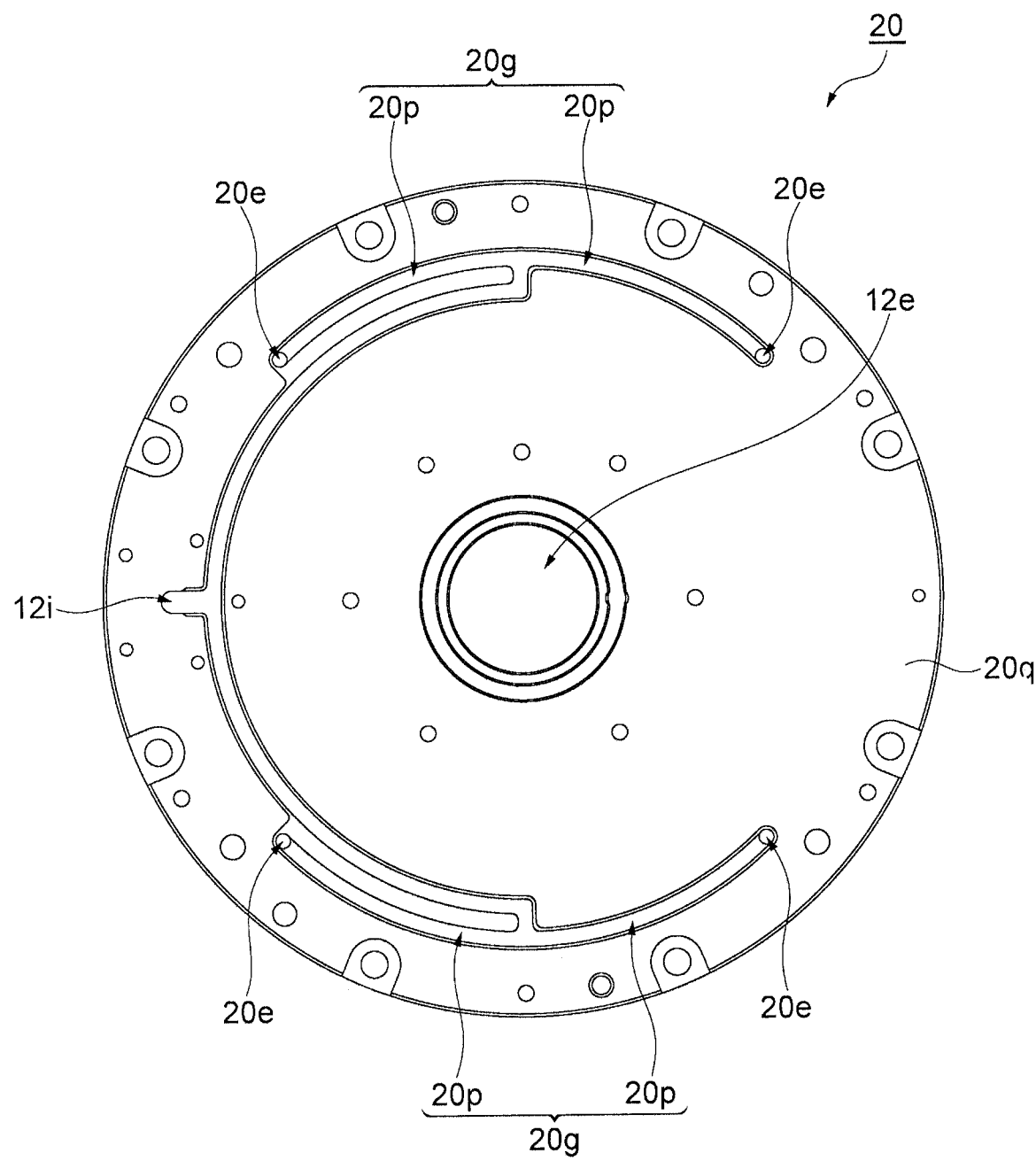
FIG. 5 is a plan view of the ceiling plate shown in FIG. 4.

The housing 12 accommodates therein the tray assembly 14 and the cylindrical members 16. The housing 12 has a bottom plate 18, a ceiling plate 20, and a sidewall 22. FIG. 3 is a perspective view of the sidewall and the bottom plate of the housing of the source material container shown in FIG. 1. FIG. 4 is a perspective view of the ceiling plate of the housing of the source material container shown in FIG. 1. FIG. 5 is a plan view of the ceiling plate shown in FIG. 4 and illustrates a state in which a flow path lid is removed from the ceiling plate.

Figure 2:
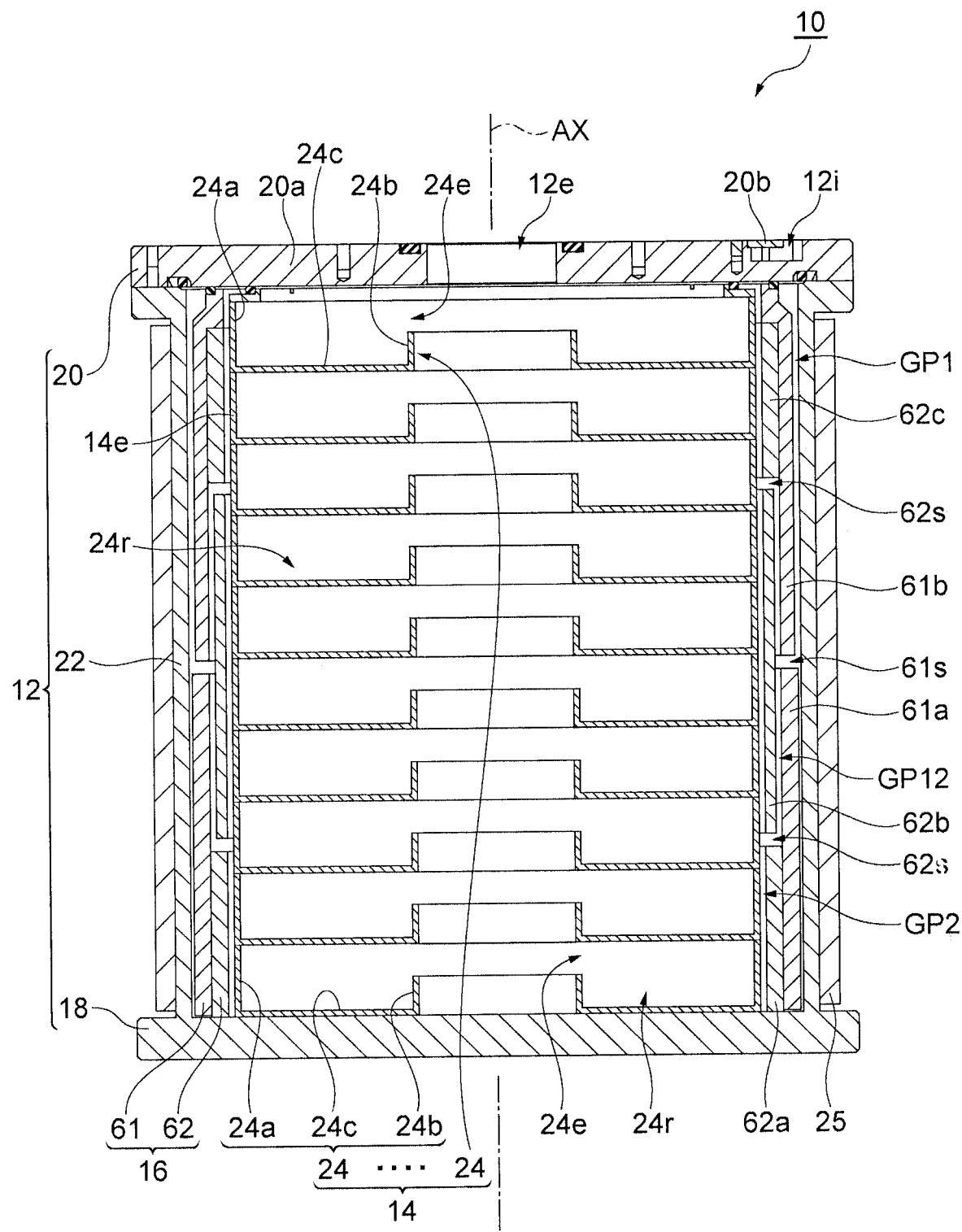
FIG. 2 is a cross sectional view of the source material container shown in FIG. 1.

As shown in FIGS. 1 to 5, the bottom plate 18 and the ceiling plate 20 have a substantially disc shape. The bottom plate 18 and the ceiling plate 20 are arranged to face each other. In this specification, the direction in which the ceiling plate 20 is positioned with respect to the bottom plate 18 is referred to as the "height direction". As shown in FIGS. 1 to 3, the sidewall 22 has a substantially cylindrical shape and extends in the height direction between the bottom plate 18 and the ceiling plate 20. In one embodiment, the bottom plate 18 and the sidewall 22 are formed in one piece. As shown in FIG. 2, a heater 25 is provided around the sidewall 22. Power is supplied to the heater 25 from a power supply. The heater 25 generates heat for sublimating a source material in each tray to be described later.

As shown in FIGS. 1 and 2, the ceiling plate 20 is mounted on the top of the sidewall 22 and fixed to the sidewall 22. A sealing member such as an O-ring or the like may be provided between the top of the sidewall 22 and the ceiling plate 20.

In one embodiment, as shown in FIGS. 1, 2, 4 and 5, the ceiling plate 20 provides the introduction port 12i and the opening 12e. The opening 12e is formed at the center of the ceiling plate 20 to penetrate through the ceiling wall 20. The introduction port 12i is formed on the peripheral portion of the ceiling plate 20 with respect to the opening 12e.

In one embodiment, the ceiling plate 20 provides a plurality of openings 20e and a plurality of flow paths 20p. The openings 20e directly communicate with a first gap GP1 to be described later. The openings 20e are formed directly above the first gap GP1. In the illustrated example, the number of the openings 20e is four. The openings 20e communicate with the introduction port 12i through the flow paths 20p. The flow paths 20p have equal flow path lengths. The openings 20e are formed at a plurality of positions rotationally symmetrical with respect to the center axis AX of the source material container 10, i.e., the central axis of the housing 12 and the sidewall 22.

In one embodiment, the ceiling plate 20 has a main body 20a and a lid 20b. The main body 20a has a substantially disc shape. The opening 12e is formed at the center of the main body 20a to penetrate through the main body 20a. The upper surface of the main body 20a defines a groove 20g. The groove 20g is branched at one end thereof into two parts, and branched further at each of the two parts into two additional parts. In other words, the groove 20g is branched at one end thereof into two parts and each of the two parts is branched at the end thereof, thus the branched lines extending to four other ends. Distances from one end of the groove 20g to each of the four other ends are equal. The groove 20g is covered by the lid 20b except one end portion thereof, the one end portion of the groove 20g being used as the introduction port 12i. The main body 20a provides four holes. These four holes extend from the four other ends of the groove 20g to the lower surface of the main body 20a. These four holes are used as the openings 20e. The flow paths from one end of the groove 20g to the four other ends of the groove 20g are used as the flow paths 20p.

As shown in FIGS. 1 and 2, the tray assembly 14 is provided in the housing 12. The tray assembly 14 includes a plurality of trays 24. The number of trays 24 is two or more. Each tray 24 is made of a material, e.g., aluminum, having excellent thermal conductivity. The surface of each tray 24 may be coated.

Figure 6:
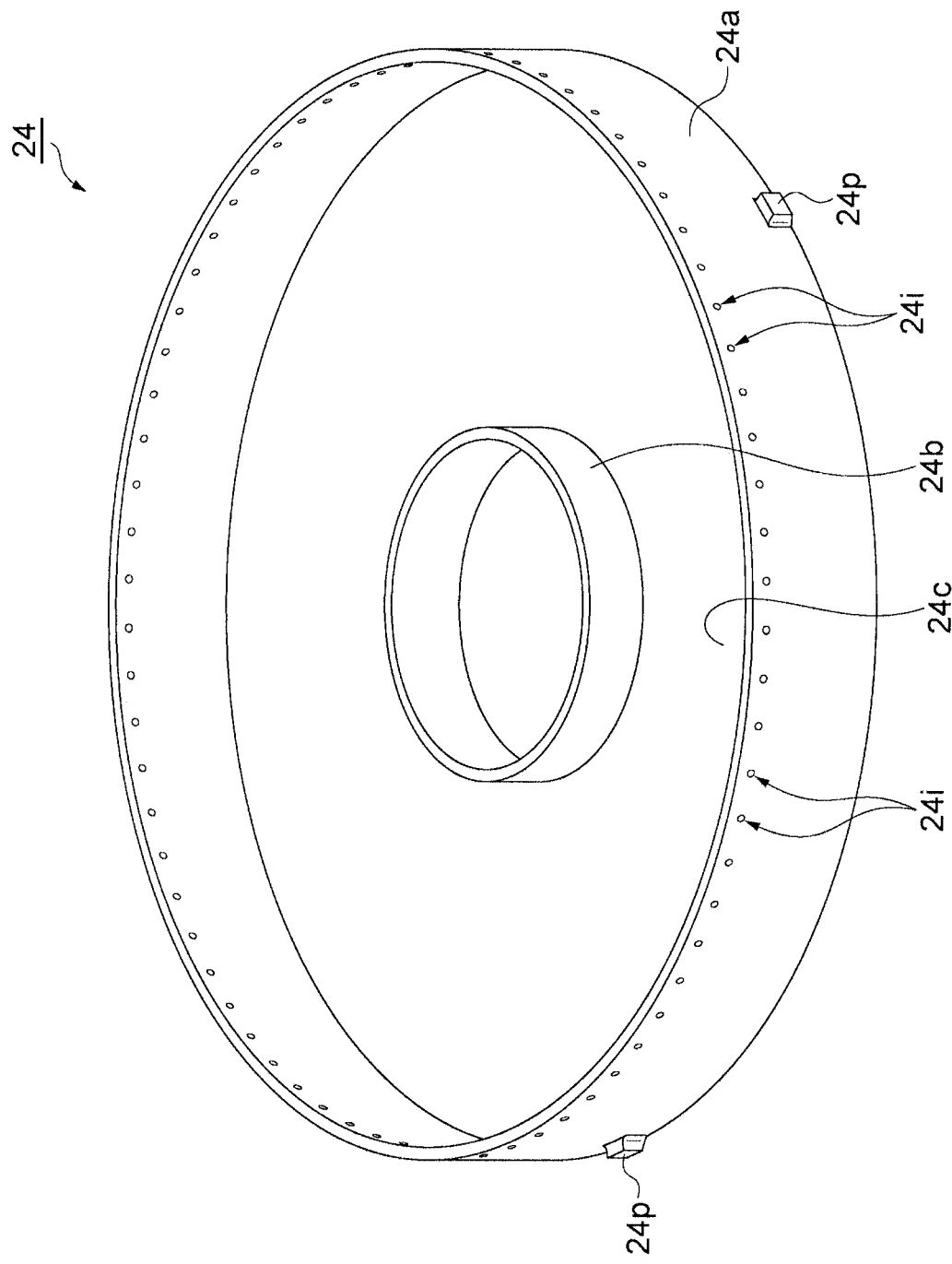
FIG. 6 is a perspective view of a tray of the raw material container shown in FIG. 1.

The trays 24 are stacked in the height direction in the housing 12. FIG. 6 is a perspective view of the tray of the source material container shown in FIG. 1. As shown in FIGS. 1, 2, and 6, each tray 24 has a first wall 24a, a second wall 24b, and a third wall 24c. Each of the first wall 24a and the second wall 24b has a substantially cylindrical shape. In each tray 24, the second wall 24b is provided inside the first wall 24a. In each tray 24, the third wall 24c constitutes a bottom plate and extends between the first wall 24a and the second wall 24b.

Each tray 24 defines a region 24r by the first wall 24a, the second wall 24b and the third wall 24c. The source material is accommodated in the region 24r. The source material is used for forming a film on the substrate. The film formed on the substrate is, e.g., a metal film. In that case, the source material contains a metal. The metal film is, e.g., a ruthenium film. In that case, the source material may contain ruthenium carbonyl ($Ru_3(CO)_{12}$). Alternatively, the source material may contain rhenium carbonyl ($Re_2(CO)_{10}$), $W(CO)_6$, $Mo(CO)_6$, $Co_2(CO)_8$, $Rh_4(CO)_{12}$, $Cr(CO)_6$ or $Os_3(CO)_{12}$.

The first wall 24a of each tray 24 may provide one or more inlets 24i. In the illustrated example, the first wall 24a of each tray 24 provides a plurality of inlets 24i. The inlets 24i are arranged along the circumferential direction with respect to the central axis of the first wall 24a. Each inlet 24i extends from the outer peripheral surface of the first wall 24a to the inner peripheral surface to penetrate through the first wall 24a. The carrier gas supplied into the housing 12 through the introduction port 12*i* is introduced into the regions 24*r* of the trays 24 through the inlets 24*i*.

A plurality of protrusions 24*p* is formed on the outer peripheral surface of the first wall 24*a*. The protrusions 24*p* are arranged in the circumferential direction with respect to the central axis of the first wall 24*a*. As will be described later, a plurality of cylindrical members 16 is arranged between the tray assembly 14 and the sidewall 22 of the housing 12. The protrusions 24*p* of each tray 24 are in contact with the inner peripheral surface of the innermost cylindrical member among the cylindrical members 16. Accordingly, the positions of the trays 24 in the radial direction with respect to the center axis AX in the housing 12 are determined. The trays 24 are positioned in the housing 12 such that the center axes of the first walls 24*a* and the second walls 24*b* coincide with the central axis AX.

As shown in FIGS. 1 and 2, the trays 24 are stacked in the housing 12 such that the upper end of the first wall 24*a* and the lower end of the first wall 24*a* positioned above are in contact with each other. The first wall 24*a* of each tray 24 constitutes an outer wall 14*e* of the tray assembly 14.

The second wall 24*b* of each tray 24 provides an outlet 24*e*. In one embodiment, a gap used as the outlet 24*e* is formed between the upper end of the second wall 24*b* and the lower end of the second wall 24*b* positioned above, or between the upper end of the uppermost second wall 24*b* and the ceiling plate 20. The gas containing source material vapor and the carrier gas is outputted from the opening 12*e* through the outlet 24*e*.

As shown in FIGS. 1 and 2, the cylindrical members 16 are arranged in the radial direction with respect to the center axis AX between the sidewall 22 of the housing 12 and the outer wall 14*e* of the tray assembly 14. Each cylindrical member 16 has a substantially cylindrical shape. The cylindrical members 16 are arranged in the housing 12 such that the center axes thereof coincide with the central axis AX. Each cylindrical member 16 is made of a material, e.g., aluminum, having excellent thermal conductivity. The surface of each cylindrical member 16 may be coated.

In the embodiment shown in FIGS. 1 and 2, the source material container 10 includes two cylindrical members, i.e., a first cylindrical member 61 and a second cylindrical member 62. In the present embodiment, the first cylindrical member 61 is the outermost cylindrical member, and the second cylindrical member 62 is the innermost cylindrical member.

The first gap GP1 is provided between the first cylindrical member 61 (i.e., the outermost cylindrical member) and the sidewall 22 of the housing 12. The first gap GP1 communicates with the introduction port 12*i*. In one embodiment, the openings 20*e* are provided directly above the first gap GP1, and the first gap GP1 communicates with the introduction port 12*i* through the openings 20*e* and the flow paths 20*p*.

Figure 7:
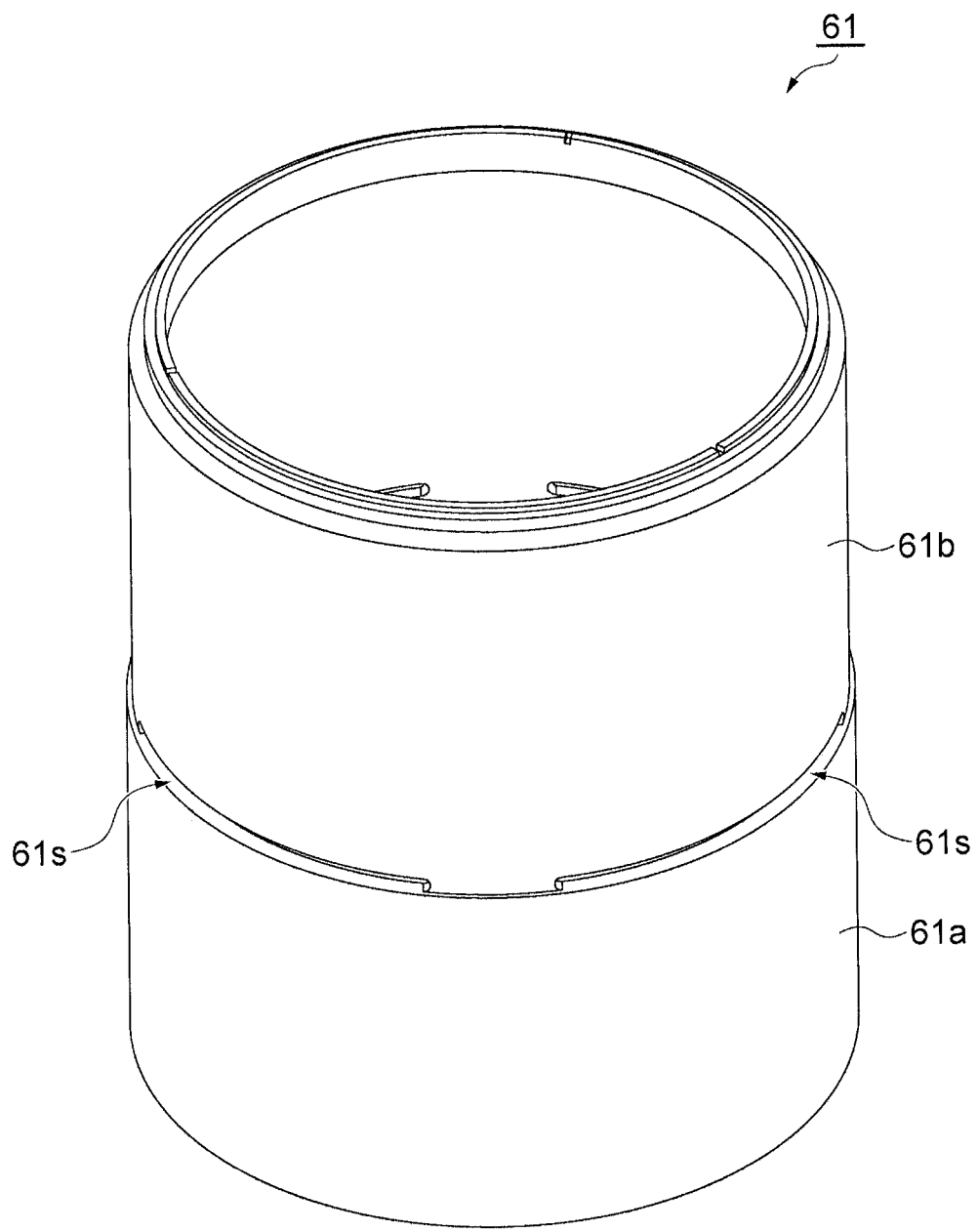
FIG. 7 is a perspective view of a first cylindrical member of the source material container shown in FIG. 1.

FIG. 7 is a perspective view of the first cylindrical member of the source material container shown in FIG. 1. As shown in FIG. 7, the first cylindrical member 61 provides a slit 61*s*. The slit 61*s* penetrates through the first cylindrical member 61 in the radial direction and is provided at an intermediate position in the height direction of the first cylindrical member 61 and extends in the circumferential direction with respect to the center axis of the first cylindrical member 61. In the example shown in FIG. 7, the slit 61*s* includes four openings extending in the circumferential direction, and the four openings are arranged in the circumferential direction.

In one embodiment, the first cylindrical member 61 has a first portion 61*a* and a second portion 62*b* as shown in FIG. 7. The first portion 61*a* corresponds to a portion below the slit 61*s* in the first cylindrical member 61. The second portion 61*b* corresponds to a portion above the first portion 61*a* in the first cylindrical member 61. The outer peripheral surface of the first portion 61*a* has a diameter greater than that of the outer peripheral surface of the second portion 62*b*. The first portion 61*a* is in contact with the inner peripheral surface of the sidewall 22. The first gap GP1 is provided between the outer peripheral surface of the second portion 61*b* and the inner peripheral surface of the sidewall 22.

A second gap GP2 is provided between the second cylindrical member 62 (i.e., the innermost cylindrical member) and the outer wall 14*e* of the tray assembly 14. All of the cylindrical members 16 except the first cylindrical member 61 provide a plurality of slits extending in the circumferential direction at different locations in the height direction to provide a plurality of flow paths branched in a stepwise manner from the slit 61*s* to communicate with the second gap GP2. The slits penetrate through the corresponding cylindrical members in the radial direction.

Figure 8:
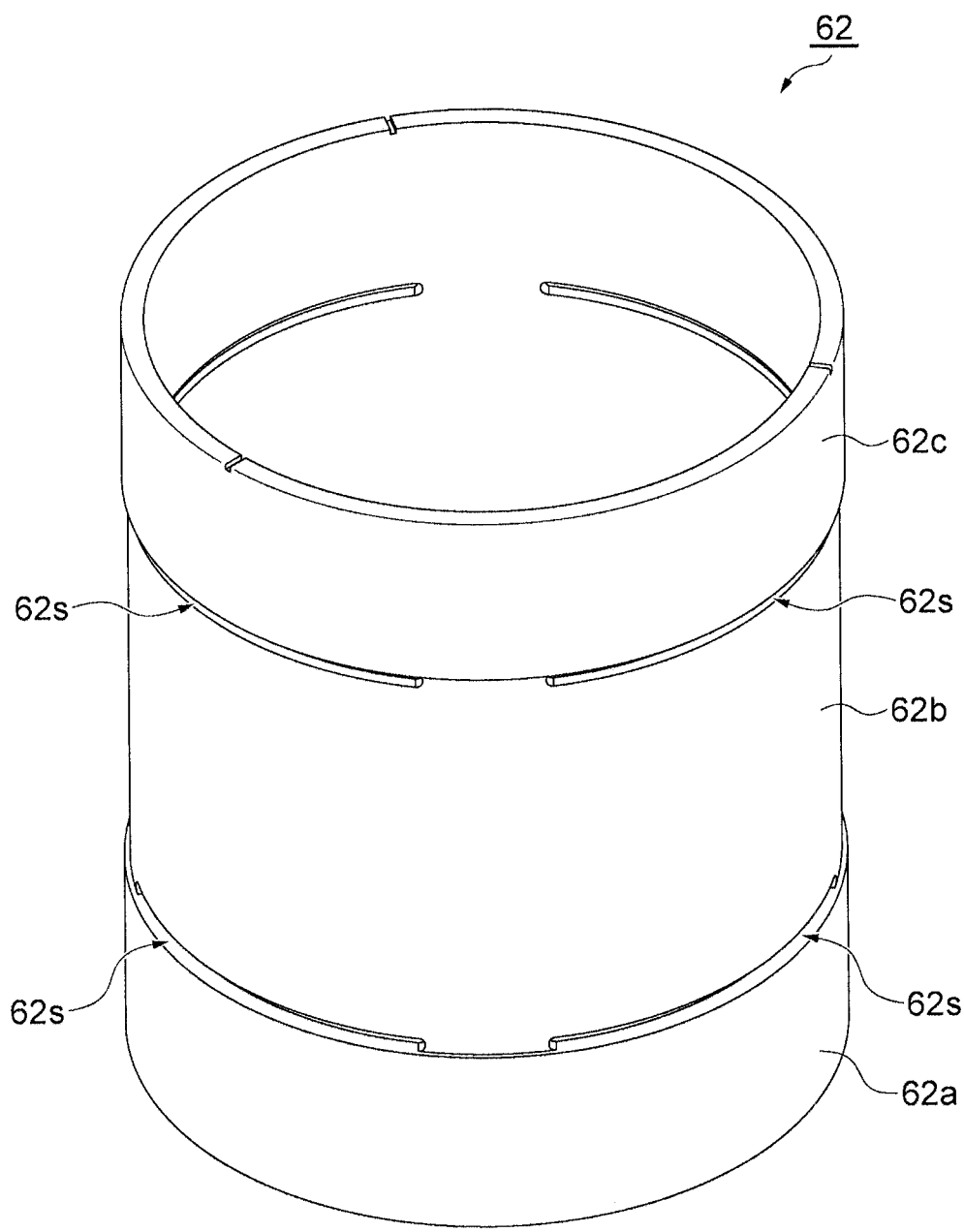
FIG. 8 is a perspective view of a second cylindrical member of the source material container shown in FIG. 1.

In the source material container 10 shown in FIGS. 1 and 2, the second cylindrical member 62 provides two flow paths branched from the slit 61*s*. FIG. 8 is a perspective view of the second cylindrical member of the source material container shown in FIG. 1. As shown in FIGS. 1, 2, and 8, the second cylindrical member 62 provides two slits 62*s*. The two slits 62*s* penetrate through the second cylindrical member 62 in the radial direction. The two slits 62*s* are provided at different positions in the height direction and extend in the circumferential direction with respect to the central axis of the second cylindrical member 62. In the example shown in FIG. 8, each slit 62*s* includes four openings extending in the circumferential direction, and the four openings are arranged in the circumferential direction.

The two slits 62*s* are provided above and below the slit 61*s*. A gap GP12 is provided between the first cylindrical member 61 and the second cylindrical member 62. The gap GP12 extends upward and downward from the slit 61*s* to communicate with the two slits 62*s*. In one embodiment, the two slits 62*s* have an equal distance to the slit 61*s*.

In one embodiment, the second cylindrical member 62 has a first portion 62*a*, a second portion 62*b*, and a third portion 62*c* as shown in FIG. 8. The first portion 62*a* corresponds to a portion below the lower slit 62*s* in the second cylindrical member 62. The third portion 62*c* corresponds to a portion above the upper slit 62*s* in the second cylindrical member 62. The second portion 62*b* corresponds to a portion between the first portion 62*a* and the third portion 62*c* in the second cylindrical member 62. The outer peripheral surface of the first portion 62*a* and the outer peripheral surface of the third portion 62*c* have a diameter greater than that of the outer peripheral surface of the second portion 62*b*. The outer peripheral surface of the first portion 62*a* and the outer peripheral surface of the third portion 62*c* are in contact with the inner peripheral surface of the first cylindrical member 61. The gap GP12 is provided between the outer peripheral surface of the second portion 62*b* and the inner peripheral surface of the first cylindrical member 61.

In the source material container 10, from the introduction port 12*i* to the gap (i.e., the second gap GP2) between the outer wall 14*e* of the tray assembly 14 and the innermost cylindrical member (e.g., the second cylindrical member 62), the flow path of the carrier gas is branched in a stepwise manner in the height direction by the cylindrical members 16. Therefore, the difference in the amount of the carrier gas supplied into the trays 24 is decreased. Accordingly, the difference in the amount of consumption of the source material accommodated in the trays 24 is decreased.

In one embodiment, the distances from the slit 61s to the two slits 62s of the second cylindrical member 62 are equal. In the present embodiment, the amount of the carrier gas flowing through the two slits 62s of the second cylindrical member 62 is substantially equal. Therefore, the difference in the amount of consumption of the source material accommodated in the trays 24 is further decreased.

In one embodiment, as described above, the openings 20e are formed at rotationally symmetrical positions, and the flow paths 20p communicating with the introduction port 12i and the openings 20e have the same flow path length. In accordance with the present embodiment, the carrier gas is supplied to the first gap GP1 substantially uniformly in the circumferential direction.

The source material container 10 shown in FIGS. 1 and 2 may have three or more cylindrical members 16. All of the cylindrical members 16 except the outermost cylindrical member (the first cylindrical member 61) provide a plurality of slits extending in the circumferential direction at different locations in the height direction to provide a plurality of flow paths that are branched in a stepwise manner from the slit of the outermost cylindrical member to communicate with the second gap GP2.

For example, the cylindrical members 16 may further include a third cylindrical member. The third cylindrical member is provided inside the second cylindrical member 62 and next to the second cylindrical member 62. The third cylindrical member provides two pairs of slits, i.e., four slits. Two slits in one of the two pairs are provided above and below one of the two slits 62s of the second cylindrical member 62. Two slits in one of the two pairs have the same distance to one of the two slits 62s of the second cylindrical member 62. The two slits in the other pair are provided above and below the other one of the two slits 62s of the second cylindrical member 62. The two slits in the other pair have the same distance to the other slit 62s of the second cylindrical member 62.

Figure 9:
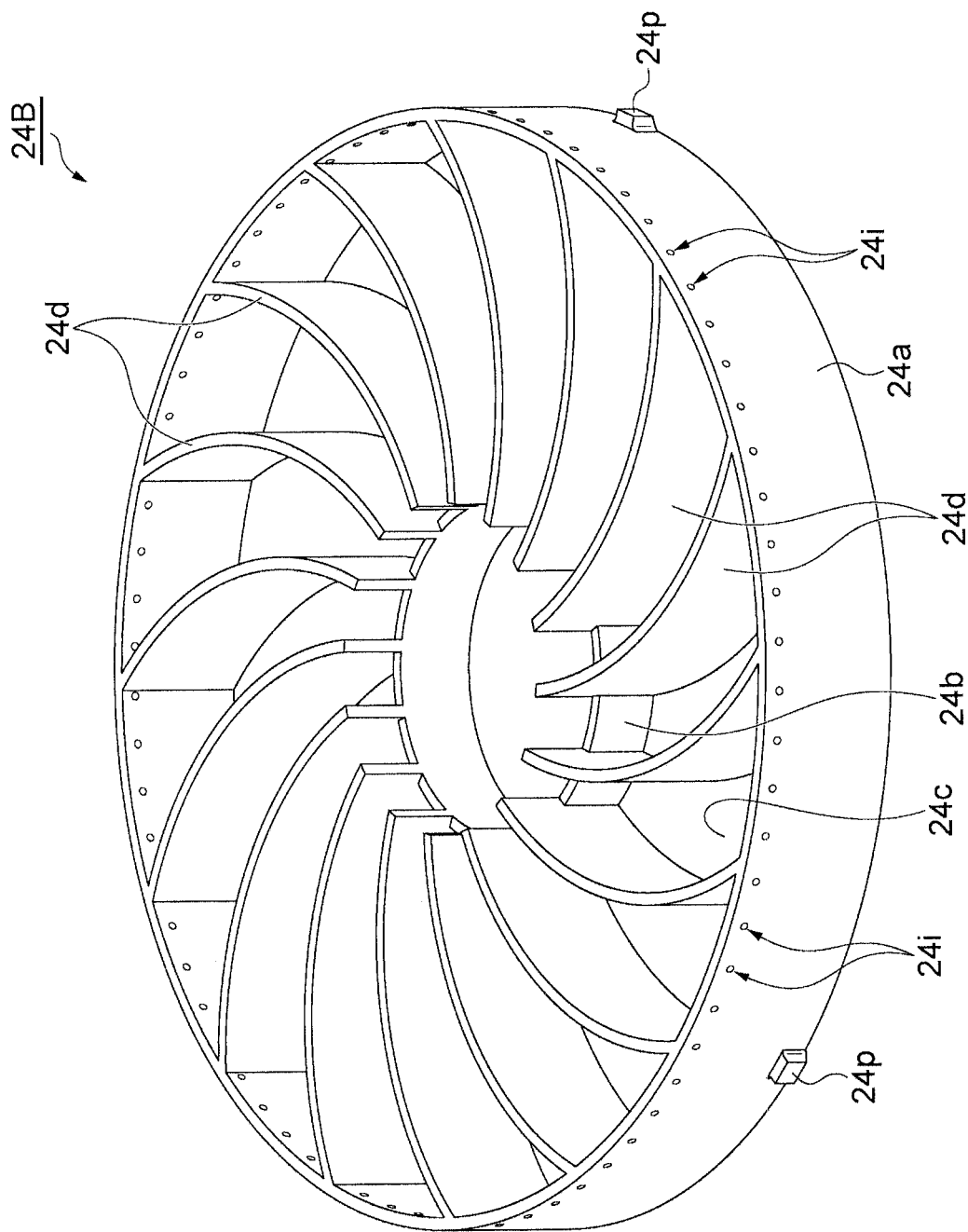
FIG. 9 is a perspective view of another tray that can be used as each tray of the source material container shown in FIG. 1.

Hereinafter, FIG. 9 will be referred to. FIG. 9 is a perspective view of another tray that can be used as a tray for the source material container shown in FIG. 1. A tray 24B shown in FIG. 9 is different from the tray 24 in that it further includes a plurality of fourth walls 24d. The fourth walls 24d extend between the first wall 24a and the second wall 24b. The fourth walls 24d are arranged along the circumferential direction. In the tray 24B, heat from the fourth walls 24d as well as the first wall 24a, the second wall 24b and the third wall 24c is transferred to the source material. Therefore, the source material is more efficiently sublimated.

Each fourth wall 24d may be curved between the first wall 24a and the second wall 24b. In the present embodiment, the flow path length of the carrier gas becomes longer in each tray 24B, and the area of the fourth walls 24d becomes greater. Therefore, the source material is sublimated even more efficiently.

Figure 10:
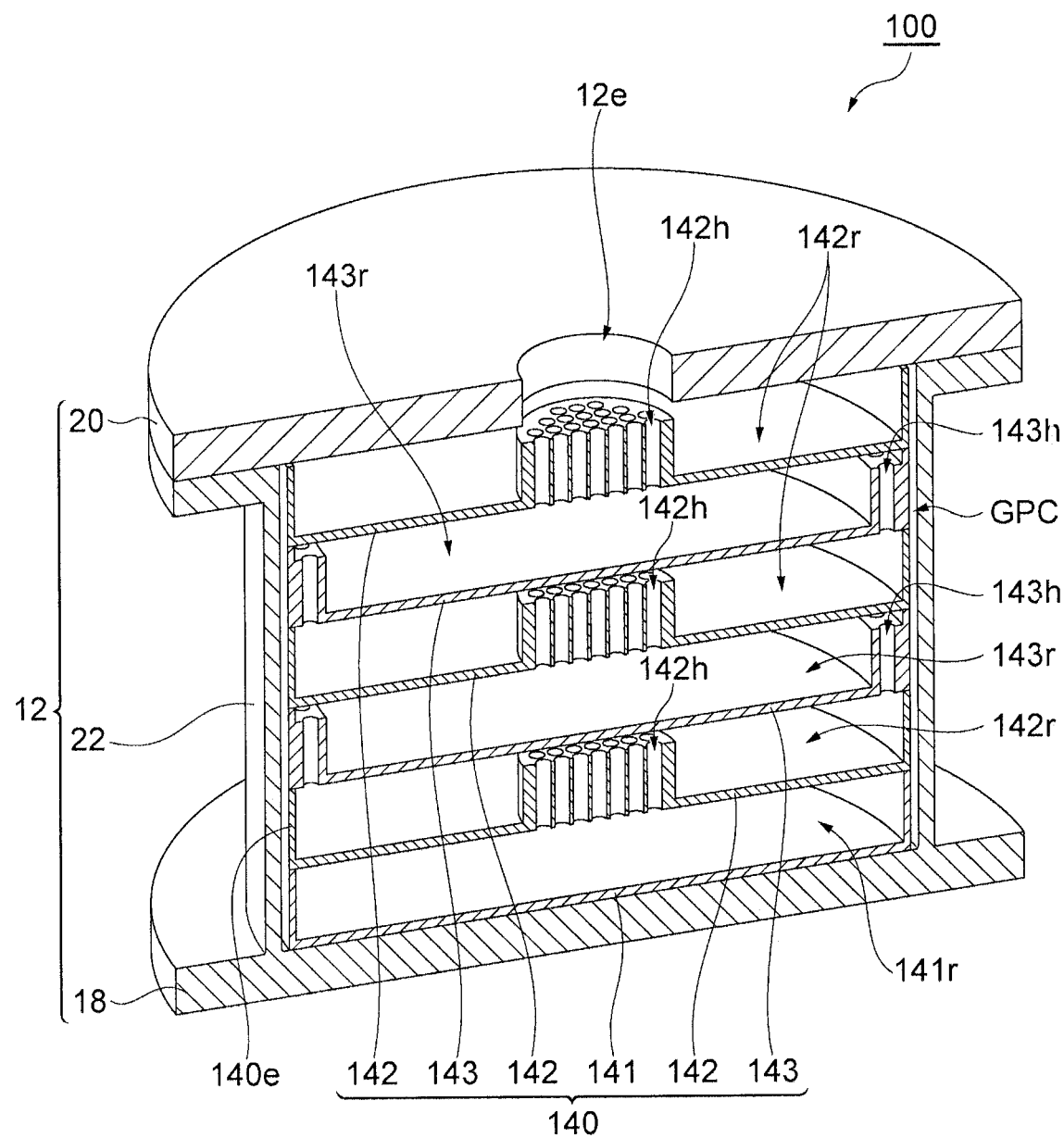
FIG. 10 is a partial cutaway perspective view of a source material container according to another embodiment.

Hereinafter, source material containers according to other embodiments will be described. FIG. 10 is a partial cutaway perspective view of a source material container according to another embodiment. The source material container 100 shown in FIG. 10 includes a housing 12 and a tray assembly 140. The housing 12 has substantially the same configuration as that of the housing 12 of the source material container 10.

The tray assembly 140 is provided in the housing 12. The tray assembly 140 includes a tray 141, one or more trays 142, and one or more trays 143. In the example shown in FIG. 10, the number of trays 142 is three and the number of trays 143 is two. The tray 141, the trays 142, and the trays 143 are stacked in the height direction in the housing 12. The tray 141 is disposed on the lowermost side. The tray 142 and the tray 143 are alternately stacked.

Figure 11:
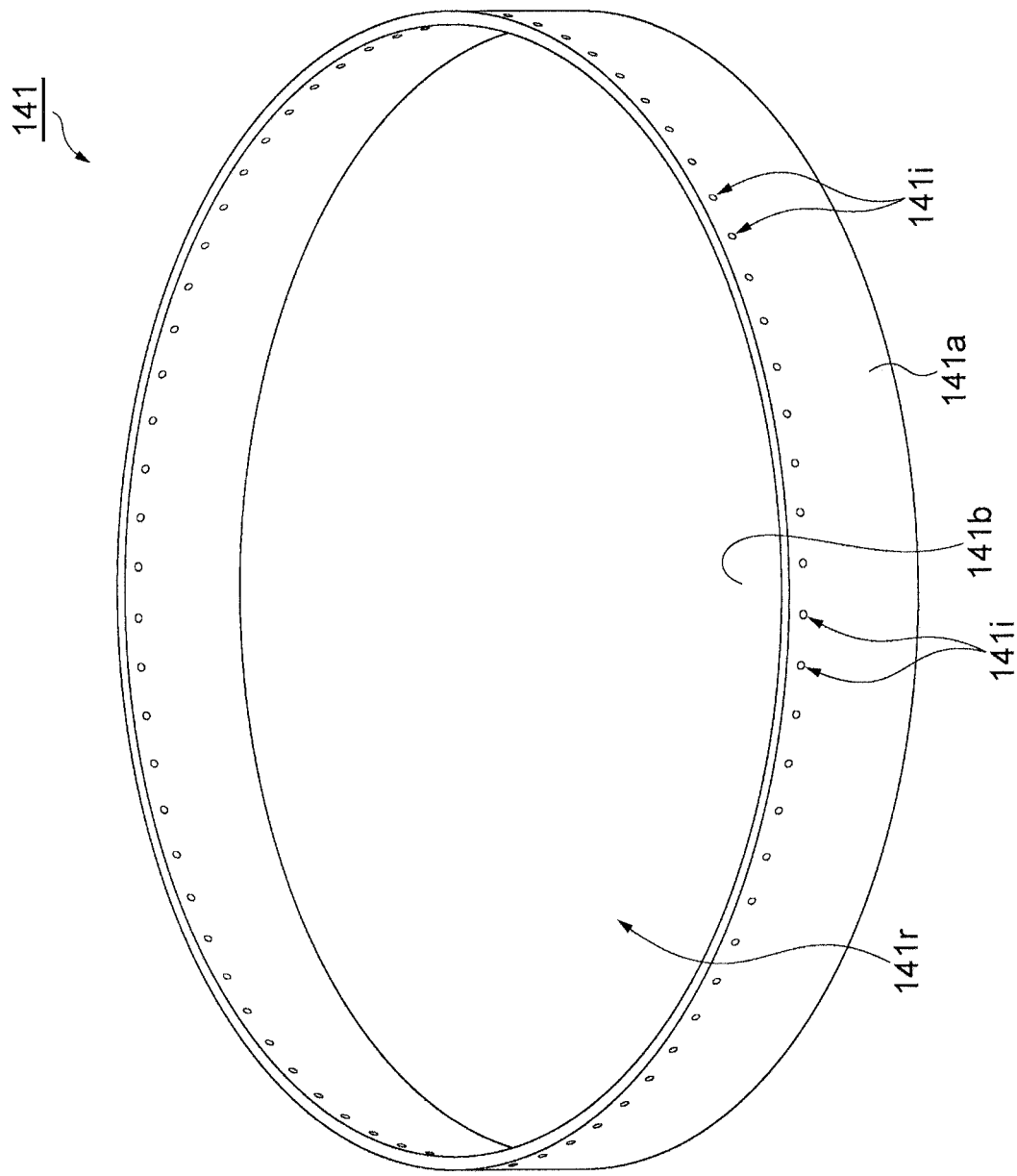
FIG. 11 is a perspective view of a tray 141.

FIG. 11 is a perspective view of the tray 141. The tray 141 has a first wall 141a and a second wall 141b. The first wall 141a has a substantially cylindrical shape. The second wall 141b blocks the opening at the lower end of the first wall 141a. The source material is accommodated in the region 141r provided within the first wall 141a and on the surface of the second wall 141b. One or more inlets 141i are formed in the first wall 141a. In the illustrated example, a plurality of inlets 141i is formed in the first wall 141a. The inlets 141i are arranged along the circumferential direction with respect to the central axis of the first wall 141a. Each inlet 141i extends from the outer peripheral surface to the inner peripheral surface of the first wall 141a to penetrate through the first wall 141a. A carrier gas is supplied to the region 141r of the tray 141 through the inlets 141i.

Figure 12:
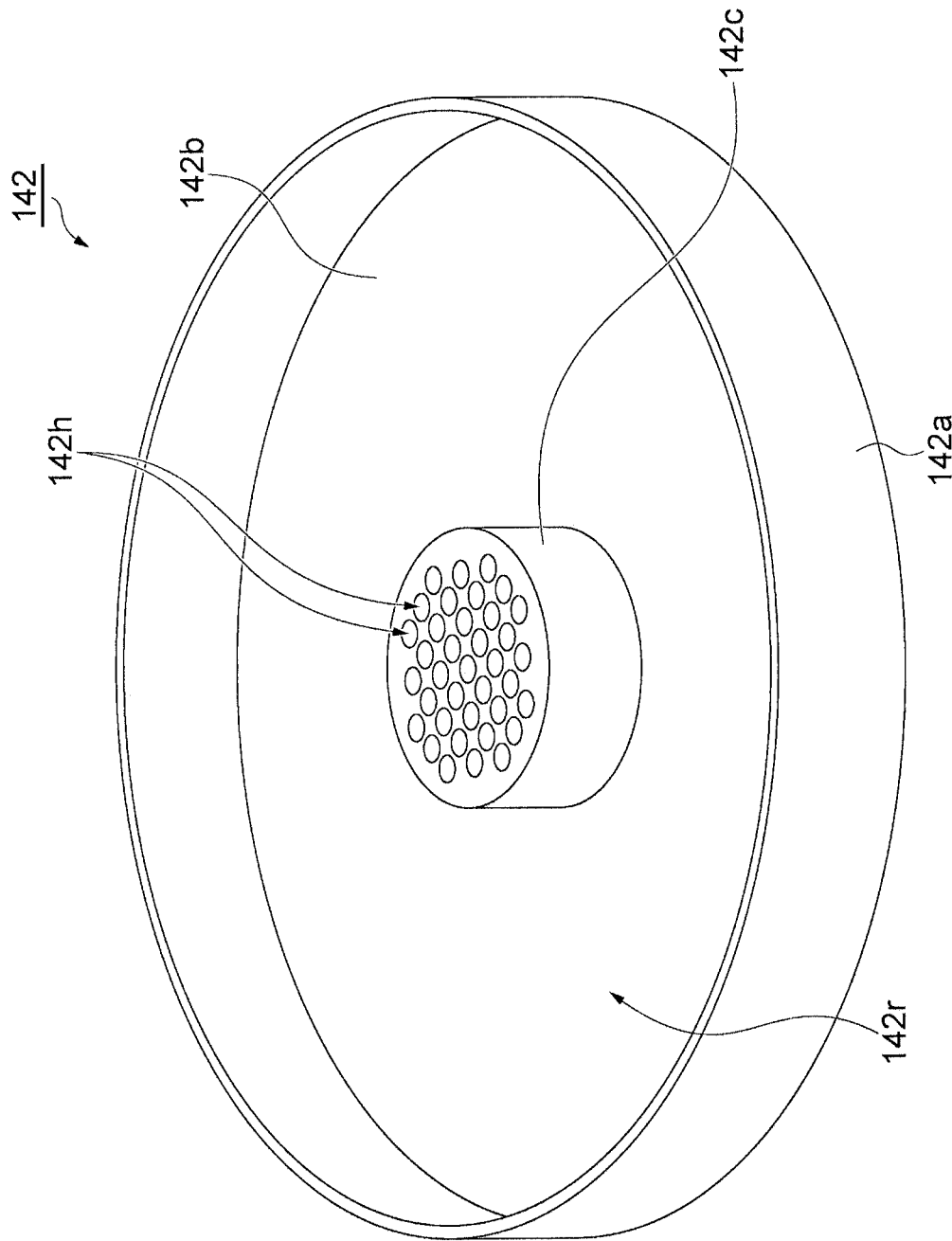
FIG. 12 is a perspective view of a tray 142.

FIG. 12 is a perspective view of the tray 142. The tray 142 has a first wall 142a, a second wall 142b, and a columnar portion 142c. The first wall 142a has a substantially cylindrical shape. The columnar portion 142c is provided at the center of the tray 142. The columnar portion 142c extends in the height direction. A plurality of through-holes 142h is formed in the columnar portion 142c. The through-holes 142h penetrate through the columnar portion 142c in the height direction. One through-hole 142h may be provided in the columnar portion 142c. The second wall 142b blocks the opening between the lower end of the first wall 142a and the lower end of the columnar portion 142c. The source material is accommodated in the region 142r provided within the first wall 142a and on the surface of the second wall 142b.

Figure 13:
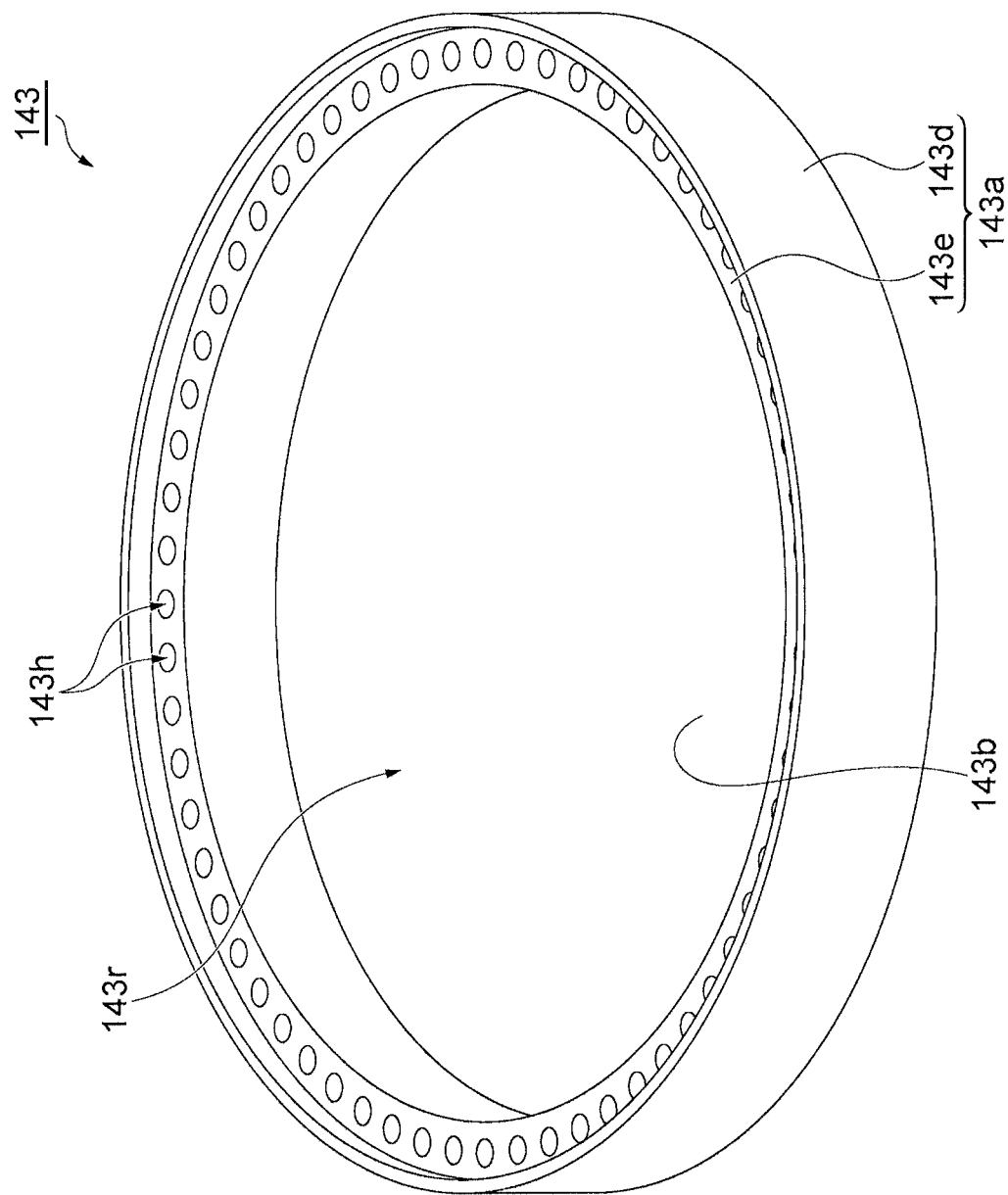
FIG. 13 is a perspective view of a tray 143.

FIG. 13 is a perspective view of the tray 143. The tray 143 has a first wall 143a and a second wall 143b. The first wall 143a has a substantially cylindrical shape. The first wall 143a includes an outer portion 143d and an inner portion 143e. The outer portion 143d has a substantially cylindrical shape. The inner portion 143e has a substantially cylindrical shape and extends inside the outer portion 143d. The inner portion 143e is integrated with the outer portion 143d. The upper end of the outer portion 143d protrudes upwardly beyond the upper end of the inner portion 143e. A plurality of through-holes 143h is formed in the inner portion 143e. The through-holes 143h penetrate through the inner portion 143e in the height direction and are arranged along the circumferential direction. One through-hole 143h may be formed in the inner portion 143e. The second wall 143b blocks the opening at the lower end of the first wall 143a. The source material is accommodated in the region 143r provided within the first wall 143a and on the surface of the second wall 143b.

As shown in FIG. 10, the first wall 141a of the tray 141, the first wall 142a of the tray 142 and the first wall 143a of the tray 143 constitute a cylindrical outer wall 140e of the tray assembly 140. A gap GPC is formed between the outer wall 140e of the tray assembly 140 and the sidewall 22 of the housing 12.

The carrier gas supplied to the introduction port 12i of the housing 12 is supplied to the region 141r of the tray 141 through the gap GPC and the inlets 141*i* of the tray 141. The carrier gas supplied to the region 141*r* is supplied to the region 142*r* of the tray 142 provided on top of the tray 141 through the through-holes 142*h*. The carrier gas supplied to the region 142*r* is supplied to the region 143*r* of the tray 143 provided on top of the tray 142 through the through-holes 143*h*. In the example shown in FIG. 10, the carrier gas supplied to the region 143*r* is supplied to the region 142*r* of the tray 142 provided on top of the tray 143 the through-holes 142*h*. In the source material container 100, the carrier gas introduced through the introduction port 12*i* flows along the above-described path and is outputted from the opening 12*e* together with the source material vapor. In the source material container 100, the length of the path of the carrier gas in the housing 12 is long and, thus, it is possible to increase the concentration of the source material in the gas outputted from the opening 12*e*.

Figure 14:
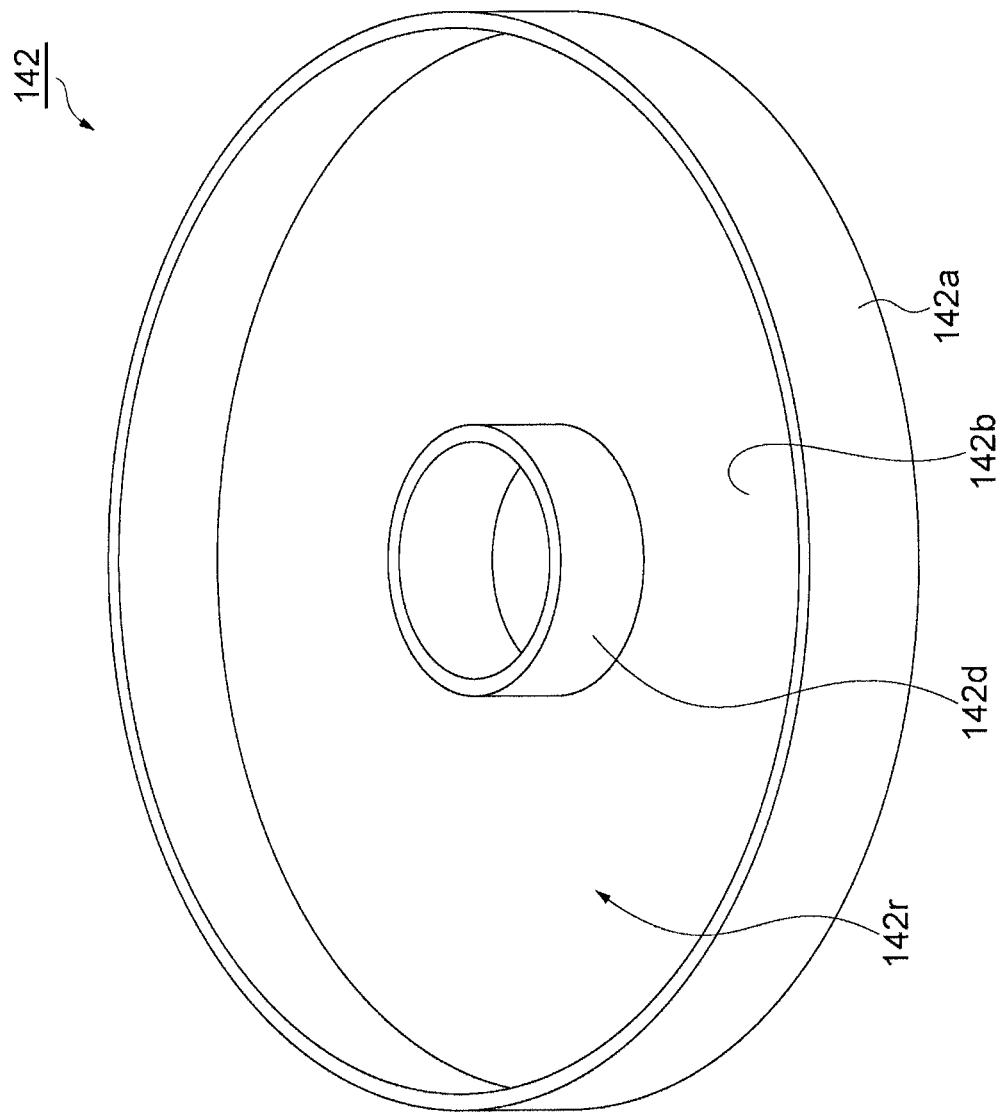
FIG. 14 is a perspective view of another example of the tray 142.

FIG. 14 is a perspective view of another example of the tray 142. The tray 142 of the source material container 100 may be the tray 142 shown in FIG. 14. The tray 142 shown in FIG. 14 has a third wall 142*d* instead of the columnar portion 142*c*. The third wall 142*d* has a substantially cylindrical shape. The third wall 142*d* is provided inside the first wall 142*a*. In the source material container 100 having the tray 142 shown in FIG. 14, the carrier gas is supplied from the lower tray to the region 142*r* of the tray 142 through an inner hole of the third wall 142*d*.

Figure 15:
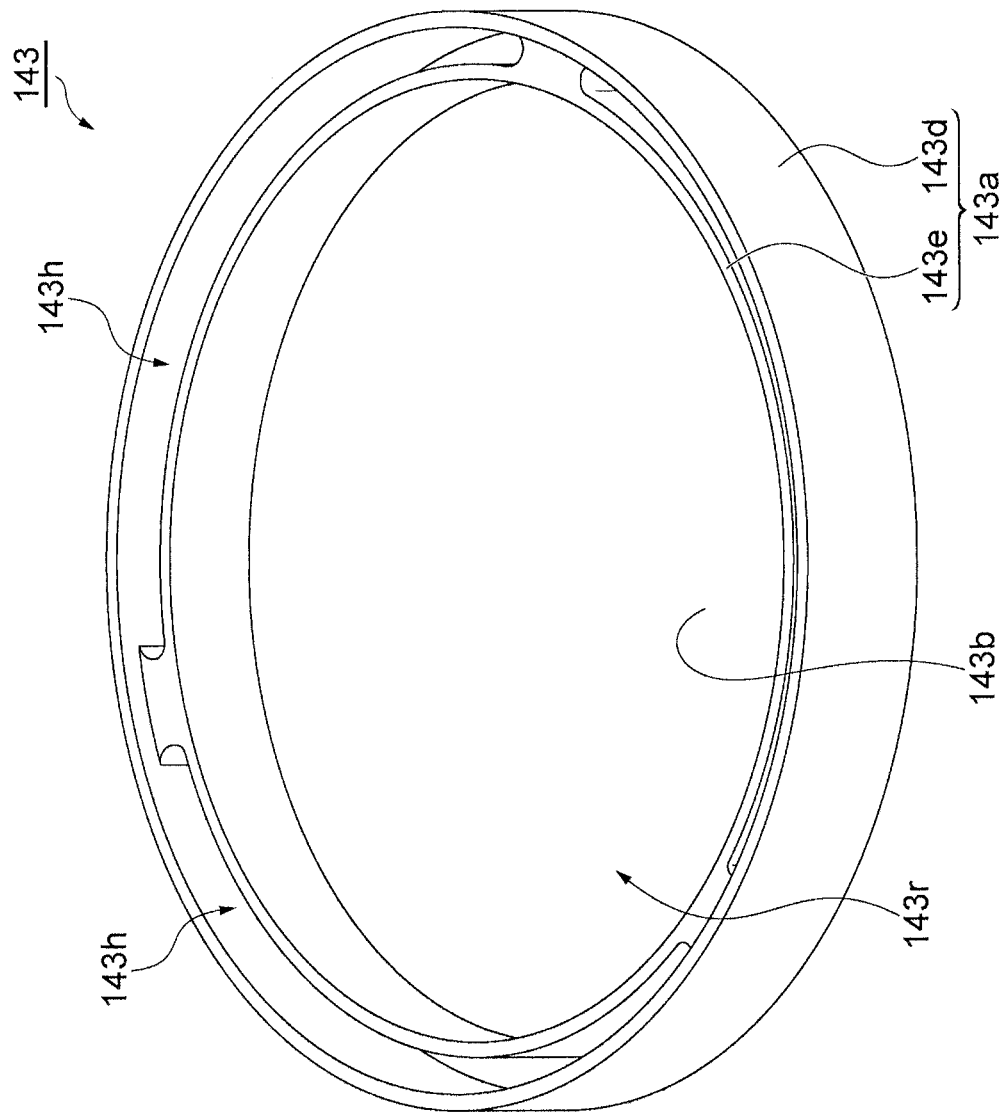
FIG. 15 is a perspective view of another example of the tray 143.

FIG. 15 is a perspective view of another example of the tray 143. The tray 143 of the source material container 100 may be the tray 143 shown in FIG. 15. In the tray 143 shown in FIG. 15, one or more slit-shaped through-holes 143*h* are formed in the inner portion 143*e* of the first wall 143*a*. The through-holes 143*h* penetrate through the inner portion 143*e* in the height direction. In the source material container 100 having the tray 143 shown in FIG. 15, the carrier gas is supplied from the lower tray to the region 143*r* of the tray 143 through the through-holes 143*h*.

Figure 16:
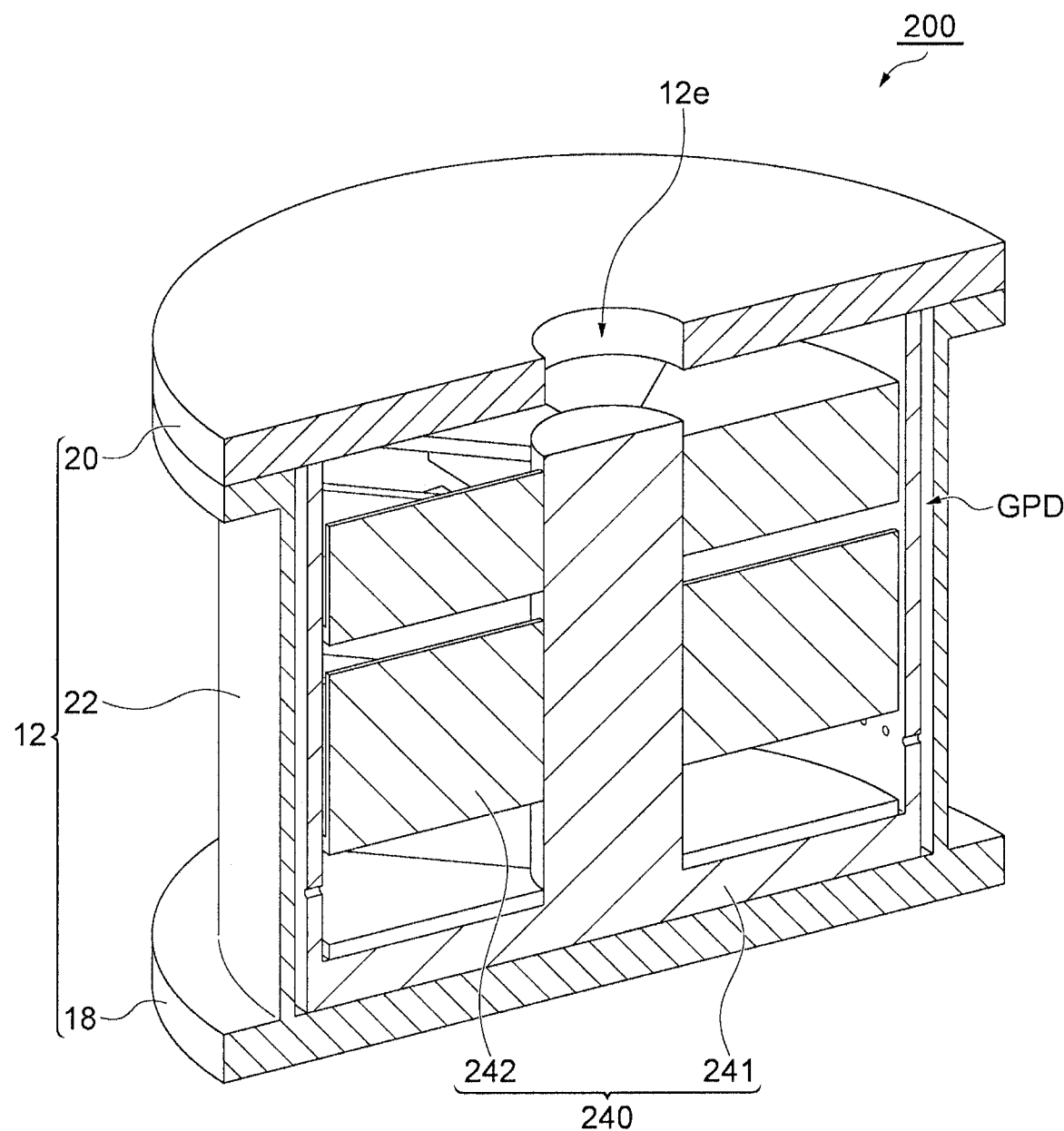
FIG. 16 is a partial cutaway perspective view of a source material container according to still another embodiment.

FIG. 16 is a perspective view of a source material container according to still another embodiment. The source material container 200 shown in FIG. 16 includes a housing 12 and a tray assembly 240. The housing 12 has substantially the same configuration as that of the housing 12 of the source material container 10. The tray assembly 240 is provided in the housing 12. The tray assembly 240 includes a first member 241 and a second member 242.

Figure 17:
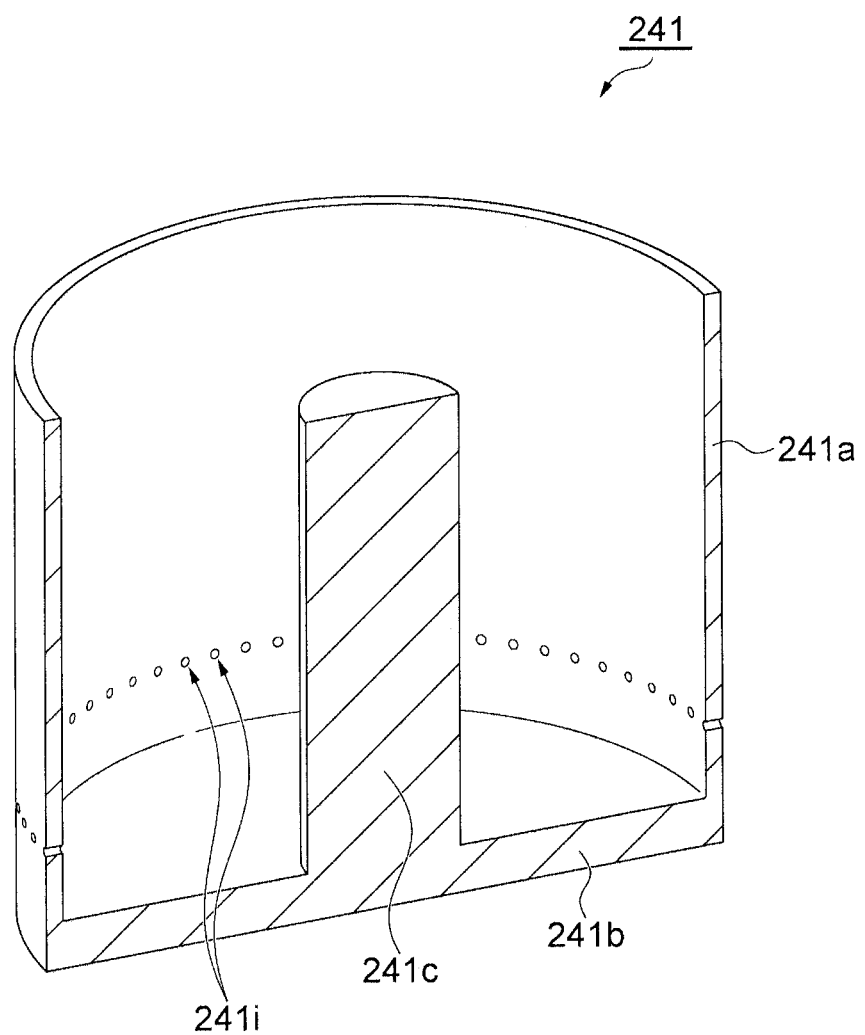
FIG. 17 is a perspective view of a first member of a tray assembly of the source material container shown in FIG. 16.

FIG. 17 is a perspective view of the first member of the tray assembly of the source material container shown in FIG. 16. The first member 241 has a first wall 241*a*, a second wall 241*b*, and a columnar portion 241*c*. The first wall 241*a* has a substantially cylindrical shape. A gap GPD is provided between the first wall 241*a* and the inner peripheral surface of the sidewall 22 of the housing 12 (see FIG. 16).

A plurality of inlets 241*i* is formed in the first wall 241*a*. The inlets 241*i* are arranged along the circumferential direction with respect to the central axis of the first wall 241*a*. Each inlet 241*i* extends from the outer peripheral surface to the inner peripheral surface of the first wall 241*a* to penetrate through the first wall 241*a*. The carrier gas supplied to the introduction port 12*i* is supplied to the inner side of the first wall 241*a* through the gap GPD. The inlets 241*i* are provided near the lower end of the first wall 241*a* so that the carrier gas can be supplied to a lowermost region among a plurality of regions 240*r* to be described later.

The columnar portion 241*c* has a substantially columnar shape. The columnar portion 241*c* extends in the height direction at the inner side of the first wall 241*a*. The second wall 241*b* extends to block the opening between the lower end of the first wall 241*a* and the lower end of the columnar portion 241*c*.

Figure 18:
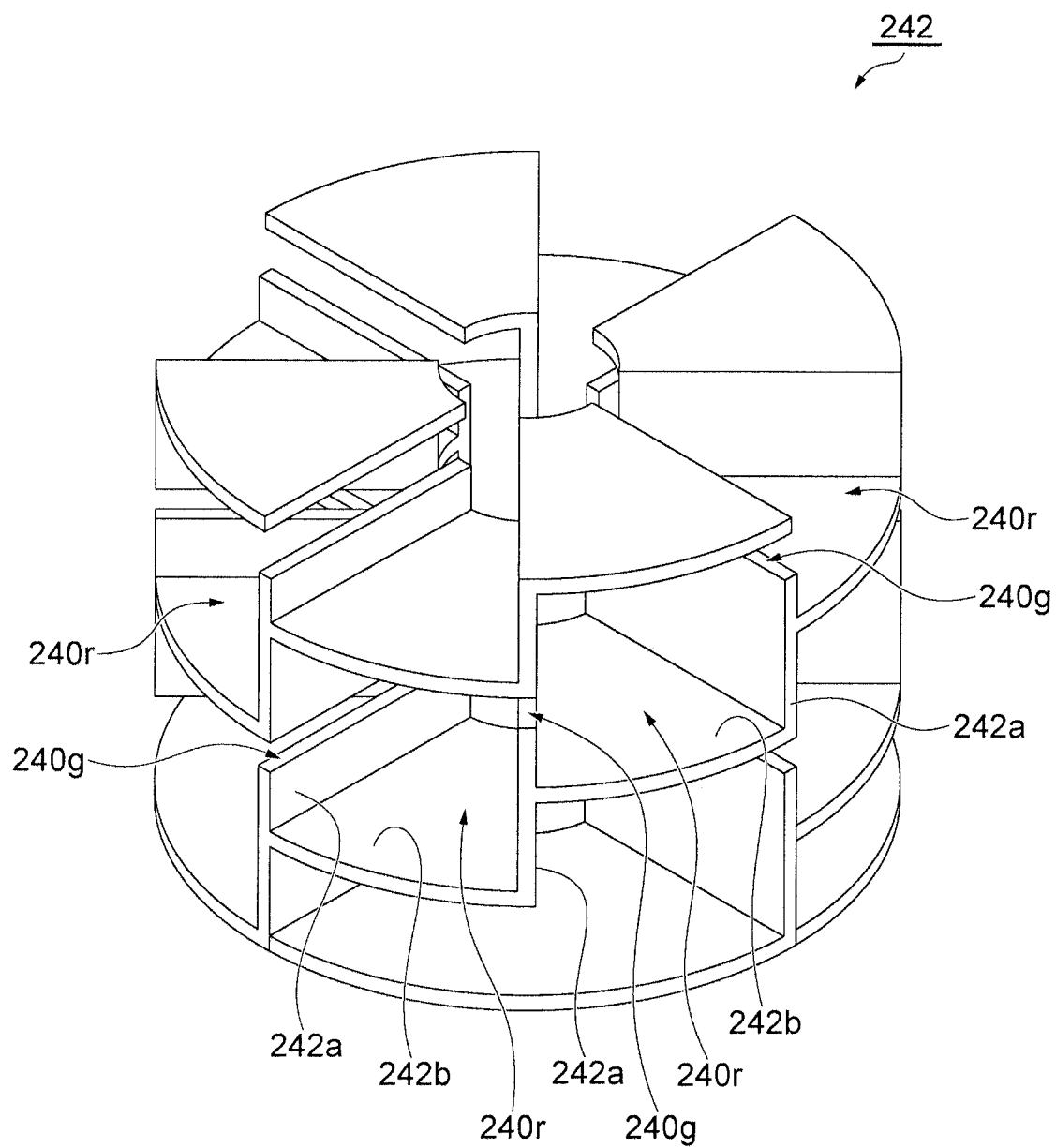
FIG. 18 is a perspective view of a second member of the tray assembly of the source material container shown in FIG. 16.

FIG. 18 is a perspective view of the second member of the tray assembly of the source material container shown in FIG. 16. The second member 242 is disposed between the first wall 241*a* and the columnar portion 241*c* of the first member 241 and on the second wall 241*b* of the first member 241. The second member 242 and the first member 241 define the regions 240*r* in which the source material is accommodated. The regions 240*r* are arranged in a spiral shape around the central axis of the source material container 200 (i.e., the central axis of the sidewall 22, the central axis of the first wall 241*a*, and the central axis of the columnar portion 241*c*).

The second member 242 has a plurality of first walls 242*a* and a plurality of second walls 242*b*. The first walls 242*a* have a plate shape and extend in the height direction and in the radial direction with respect to the central axis of the source material container 200. The first walls 242*a* are arranged in a spiral shape around the central axis of the source material container 200. Each first wall 242*a* has a pair of edges extending in the height direction. One of the pair of edges in each first wall 242*a* is connected to the columnar portion 241*c*. The other edge in each first wall 242*a* is connected to the inner peripheral surface of the first wall 241*a* of the first member 241.

The second walls 242*b* have a plate shape and extend in the circumferential direction and in the radial direction with respect to the central axis of the source material container 200. The second walls 242*b* are arranged in a spiral shape around the central axis of the source material container 200. Each second wall 242*b* extends between two first walls 242*a* adjacent to each other in the circumferential direction. Each second wall 242*b* is connected to an intermediate position in the height direction of one of the two adjacent first walls 242*a* and to the lower end of the other first wall 242*a*. The region 240*r* is provided between two adjacent first walls 242*a* and on the second wall 242*b* extending therebetween. A gap 240*g* is formed above the upper end of each first wall 242*a*.

In the source container 200, the carrier gas introduced through the introduction port 12*i* of the housing 12 is supplied to the inner side of the first wall 241*a* through the gap GPD and the inlets 241*i*. The carrier gas supplied to the inner side of the first wall 241*a* is directly supplied to the lower regions 240*r* among the plurality of regions 240*r*. The carrier gas supplied to the lower regions 240*r* flows along the spiral-shaped path through the gap 240*g* and the other regions 240*r* and is outputted from the opening 12*e* together with the source material vapor. In the source material container 200, the length of the flow path of the carrier gas in the housing 12 is long and, thus, it is possible to increase the concentration of the source material in the gas outputted from the opening 12*e*.

While the present disclosure has been shown and described with respect to the embodiments, it will be understood by those skilled in the art that various changes and modifications may be made without departing from the scope of the present disclosure as defined in the following claims.

What is claimed is:
1. A source material container comprising:
   a housing having a bottom plate, a ceiling plate and a cylindrical sidewall extending between the bottom plate and the ceiling plate, the housing providing a carrier gas introduction port and an opening through which a gas containing source material vapor is outputted; and a tray assembly accommodated in the housing, the tray assembly including a first tray, one or more second trays, and one or more third trays, wherein the first tray is disposed on the bottom plate, and the one or more second trays and the one or more third trays are alternately stacked between the first tray and the ceiling plate, wherein the first tray has a first wall and a second wall that blocks an opening at a lower end of the first wall, a plurality of inlets formed through the first wall along a circumferential direction with respect to a central axis of the first wall, and a carrier gas from the carrier introduction port supplied to an inside region of the first try through the inlets, each of the one or more second trays has a third wall, a fourth wall, and a columnar portion, the columnar portion is provided at a center of the second tray, a plurality of through-holes are formed through the columnar portion in a height direction, and the fourth wall blocks an opening between a lower end of the third wall and a lower end of the columnar portion, and each of the one or more third trays has a fifth wall and a sixth wall, the fifth wall includes an outer portion and an inner portion, a upper end of the outer portion protrudes upwardly beyond a upper end of the inner portion, a plurality of through-holes are formed through the inner portion in the height direction and are arranged along the circumferential direction, and the sixth wall blocks an opening at a lower end of the fifth wall.

2. The source material container of claim 1, wherein the first wall of the first tray, the third walls of the one or more second trays, the fifth walls of the one or more third trays constitute a cylindrical outer wall of the tray assembly, and a gap is formed between an outer wall of the tray assembly and the cylindrical sidewall of the housing.

3. The source material container of claim 2, wherein the carrier gas from the carrier gas introduction port is supplied to the inside region of the first tray through the gap and the inlets of the first tray, and the carrier gas is outputted from the opening of the housing.

4. A source material container comprising:

a housing having a bottom plate, a ceiling plate and a cylindrical sidewall extending between the bottom plate and the ceiling plate, the housing providing a carrier gas introduction port and an opening through which a gas containing source material vapor is outputted; and a tray assembly accommodated in the housing, the tray assembly including a first member and a second member, wherein the first member has a first wall, a second wall, and a columnar portion, a first gap is provided between the first wall and the cylindrical sidewall of the housing, a plurality of inlets are formed through the first wall along a circumferential direction with respect to a central axis of the first wall, the columnar portion is provided at a center of the first member, and the second wall extends to block an opening between a lower end of the first wall and a lower end of the columnar portion, and the second member is disposed between the first wall and the columnar portion of the first member and on the second wall of the first member, the first member and the second member define regions arranged in a spiral shape around the central axis.

5. The source material container of claim 4, wherein the second member has a plurality of third walls and a plurality of fourth walls, the third walls have a plate shape and extend in a height direction and in a radial direction with respect to the central axis, each of the third walls has a pair of edges extending in the height direction, one of the pair of edges in each third wall is connected to the columnar portion, the other edge is connected to an inner peripheral surface of the first wall of the first member.

6. The source material container of claim 5, the fourth walls have a plate shape and extend in the circumferential direction and in the radial direction with respect to the central axis, each fourth wall extends between two third walls adjacent to each other in the circumferential direction, each fourth wall is connected to an intermediate position in the height direction of one of the two adjacent third walls and to a lower end of the other third wall, a region is provided between two adjacent third walls and on the fourth wall extending therebetween, and a second gap is formed above a upper end of each third wall.

7. The source material container of claim 6, wherein the carrier gas from the carrier gas introduction port is supplied to an inside region of the first member through the first gap and the inlets of the first member, and the carrier gas is outputted from the opening of the housing.

* * * * *